US010057681B2

(12) United States Patent
Vautin et al.

(10) Patent No.: US 10,057,681 B2
(45) Date of Patent: Aug. 21, 2018

(54) ENTERTAINMENT AUDIO PROCESSING

(71) Applicant: BOSE CORPORATION, Framingham, MA (US)

(72) Inventors: Jeffery R. Vautin, Worcester, MA (US); Michael S. Dublin, Arlington, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/225,088

(22) Filed: Aug. 1, 2016

(65) Prior Publication Data
US 2018/0035205 A1 Feb. 1, 2018

(51) Int. Cl.
H04R 3/04 (2006.01)
H03G 3/30 (2006.01)
(Continued)

(52) U.S. Cl.
CPC ............. H04R 3/04 (2013.01); H03G 3/3005 (2013.01); H03G 3/3026 (2013.01);
(Continued)

(58) Field of Classification Search
CPC ............ H04R 2430/01; H04R 2420/01; H04R 2499/13; H04R 3/12; H04R 2227/003; H04R 2227/005; H04R 27/00; H04R 29/00; H04R 3/04; H04R 17/00; H04R 1/227; H04R 1/24; H04R 1/26; H04R 1/403; B60R 2300/302; B60R 25/257; B60R 16/0373; B60R 25/33; G06F 3/165; G06F 3/167;
(Continued)

(56) References Cited

U.S. PATENT DOCUMENTS 4,101,735 A * 7/1978 Bridenbaugh .......... H04M 9/10
379/388.01
4,748,669 A 5/1988 Klayman
(Continued)

FOREIGN PATENT DOCUMENTS

DE 3045722 A1 6/1982
EP 2434783 A1 3/2012
WO 2013135559 A1 9/2013

OTHER PUBLICATIONS

U.S. Appl. No. 14/791,758, "Simulating Acoustic Output at a Location Corresponding to Source Position Data", filed Jul. 6, 2015, 18 pages.
(Continued)

Primary Examiner — Mohammed Islam
(74) Attorney, Agent, or Firm — Patterson + Sheridan, LLP

(57) ABSTRACT

An entertainment audio processing system includes a music limiter configured to receive an audio signal, volume control information for music, and volume control information for announcement. The music limiter is further configured to calculate a gain parameter based on a music-to-announcement ratio. In another aspect, an entertainment audio processing system includes a mixer configured to substantially match a left audio signal channel and a right audio signal channel. The entertainment audio processing system further includes an equalizer configured to introduce magnitude and phase changes between the left audio signal channel and the right audio signal channel.

25 Claims, 6 Drawing Sheets

(51) Int. Cl.
*H03G 5/16* (2006.01)
*H04S 1/00* (2006.01)

(52) U.S. Cl.
CPC .............. *H03G 5/165* (2013.01); *H04S 1/002* (2013.01); *H03G 2201/307* (2013.01); *H04R 2499/13* (2013.01); *H04S 2400/13* (2013.01)

(58) Field of Classification Search
CPC ........... G06F 17/30867; G06F 17/2785; G10L 15/22; G10L 15/02; G10L 15/197; G10L 25/51; G10L 15/265; G10L 17/22; G10L 2015/088; G10L 25/48; G10L 2015/228
See application file for complete search history.

(56) References Cited

U.S. PATENT DOCUMENTS

| | | | | |
|---|---|---|---|---|
| 5,438,689 | A | 8/1995 | Kluth | |
| 6,868,385 | B1* | 3/2005 | Gerson | G10L 15/30 370/468 |
| 9,392,366 | B1* | 7/2016 | Meyer | H04R 25/50 |
| 9,615,170 | B2* | 4/2017 | Kirsch | H04R 3/002 |
| 2005/0190903 | A1* | 9/2005 | Viikki | H04M 19/041 379/142.01 |
| 2005/0192805 | A1* | 9/2005 | Kudoh | G10L 15/04 704/248 |
| 2006/0109983 | A1* | 5/2006 | Young | H04K 3/43 380/252 |
| 2007/0071206 | A1* | 3/2007 | Gainsboro | H04M 3/2281 379/168 |
| 2007/0213092 | A1* | 9/2007 | Geelen | G08G 1/0969 455/556.1 |
| 2008/0025530 | A1* | 1/2008 | Romesburg | H03F 3/68 381/107 |
| 2008/0212820 | A1* | 9/2008 | Park | H04B 1/034 381/370 |
| 2009/0061837 | A1* | 3/2009 | Chaudhri | G06F 3/0481 455/418 |
| 2010/0322429 | A1* | 12/2010 | Norvell | G10L 19/008 381/22 |
| 2011/0182283 | A1* | 7/2011 | Van Buren | H04M 3/4936 370/352 |
| 2012/0114127 | A1* | 5/2012 | Yamashita | H03G 3/3005 381/56 |
| 2012/0170756 | A1* | 7/2012 | Kraemer | H04S 7/30 381/17 |
| 2012/0253823 | A1* | 10/2012 | Schalk | G08G 1/096877 704/270.1 |
| 2012/0294461 | A1* | 11/2012 | Maeda | H03G 3/3005 381/107 |
| 2013/0339031 | A1* | 12/2013 | Yoon | G10L 15/22 704/275 |
| 2014/0172990 | A1* | 6/2014 | Wan | H04W 4/025 709/206 |
| 2014/0355765 | A1* | 12/2014 | Kulavik | H04S 7/302 381/17 |
| 2015/0215716 | A1* | 7/2015 | Srinivasan | G10L 25/27 381/86 |
| 2015/0358725 | A1* | 12/2015 | Hera | H04R 1/22 381/102 |
| 2015/0358730 | A1* | 12/2015 | Kirsch | H04R 3/002 381/71.1 |
| 2015/0365764 | A1* | 12/2015 | Yamamoto | H04R 3/12 381/97 |
| 2015/0382096 | A1* | 12/2015 | Lamar | H04R 1/1041 381/74 |

OTHER PUBLICATIONS

Invitation to Pay Additional Fees for International Application No. PCT/US2017/044551 dated Oct. 20, 2017.
International Search Report and The Written Opinion of the International Searching Authority for International Application No. PCT/US2017/044551 dated Jan. 19, 2018.

* cited by examiner

ENTERTAINMENT AUDIO PROCESSING

I. FIELD OF THE DISCLOSURE

The present disclosure relates in general to audio systems, and more particularly, to managing vehicular audio sources.

II. BACKGROUND

Many vehicle types include announcement audio to communicate information to a driver. For example, announcement audio may include navigation system audio instructions, vehicle chimes, enunciated announcements, cell phone alerts, cell phone conversations, and other non-entertainment audio sources. It can be difficult to hear with clarity an incoming announcement audio when an entertainment audio is already playing in an audio system.

III. SUMMARY

All examples and features mentioned below can be combined in any technically possible way.

In one aspect, an apparatus includes a music limiter configured to receive an audio signal, volume control information for music, and volume control information for announcement. In a particular implementation, the music limiter is configured to calculate a gain parameter based on a music-to-announcement ratio. The music-to-announcement ratio is an indication of how much quieter or louder a music relative to an announcement. The music-to-announcement ratio may be based on an application. The application corresponds to various make and model of different type of vehicles.

In another aspect, an apparatus includes a mixer configured to substantially match a left audio signal channel and a right audio signal channel. The mixer is coupled to an equalizer. The equalizer is configured to introduce magnitude and phase differences between the left audio signal channel and the right audio signal channel. According to a particular implementation, the apparatus includes a music limiter configured to receive volume control information for music and volume control information for announcement. The music limiter is configured to calculate a gain parameter based on a music-to-announcement ratio.

In another aspect, a method includes receiving an audio signal. The audio signal includes at least one of an audio music signal and an audio announcement signal. In a particular implementation, the method includes adjusting a level of the audio music signal relative to a level of the audio announcement signal based on a music-to-announcement ratio. The music-to-announcement ratio indicates how much quieter or louder a music audio is relative to an announcement audio. According to another particular implementation, the method includes performing spatial signal processing in response to adjusting the level of the audio music signal relative to the level of the audio announcement signal. The spatial signal processing includes substantially matching a left audio signal channel and a right audio signal channel. In a particular implementation, the method includes introducing magnitude and phase differences between the left audio signal channel and the right audio signal channel.

IV. BRIEF DESCRIPTION OF THE DRAWINGS

V. DETAILED DESCRIPTION

An audio system of a vehicle plays entertainment audio, such as music and/or television (TV) or radio programs that are pre-recorded or live. Occasionally, the audio system initiates an audio announcement to be played over ongoing music or other entertainment audio. An implementation of the system automatically adjusts a level of a music audio signal relative to and in response to a level of an announcement audio signal. The automatic adjustment enhances an ability of a listener to focus, clearly hear, distinguish, or understand the announcement audio, e.g., without having to mute the entertainment audio.

The audio system includes an entertainment audio processing system that focuses listener attention to the announcement audio instead of the music audio. For example, the entertainment audio processing system adjusts the level of the audio music signal relative to the level of the audio announcement signal based on a music-to-announcement ratio. The music-to-announcement ratio indicates how much quieter or louder the audio music signal is relative to the audio announcement signal. The music-to-announcement ratio is associated with one or more applications. For instance, the applications correspond to the make and model of different type of vehicles.

In different examples, the music-to-announcement ratio is tuned at a manufacturer of the entertainment audio processing system, a manufacturer of the vehicle, or by a listener. The entertainment audio processing system may include one or more knobs used to tune or optimize the music-to-announcement ratio. A listener may adjust, readjust, and save a tuned music-to-announcement ratio. The entertainment audio processing system uses the saved music-to-announcement ratio when an announcement is present.

The entertainment audio processing system introduces spatial changes to an audio music signal to focus attention to the announcement audio, instead of the music audio. The spatial changes include matching a left audio signal channel and a right audio signal channel. The spatial changes further include introducing magnitude and phase differences between the left audio signal channel and the right audio signal channel. In this manner, downstream processors render output audio signals associated with the audio musical signal differently in space. Thus, an early introduction (or application) of the spatial changes on a signal path may change what a downstream processor would subsequently perform without directly changing properties of the one or more downstream processors.

Various illustrative implementations of an entertainment audio processing system are illustrated herein. However, the various illustrative implementations are not to be regarded as exhaustive implementations of the entertainment audio processing system disclosed in this application.

Figure 1:
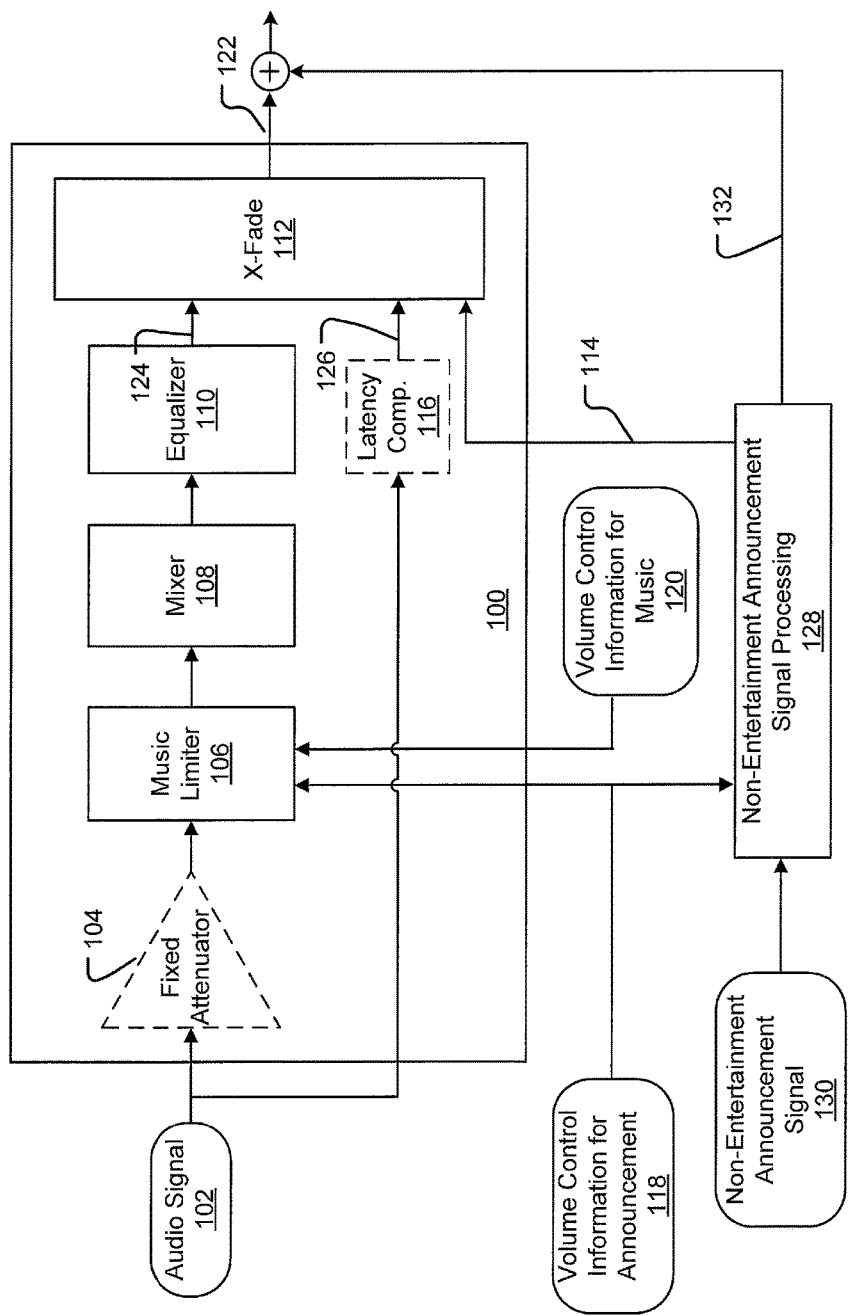
FIG. 1 is a block diagram of an illustrative implementation of an entertainment audio processing system.

FIG. 1 depicts an entertainment audio processing system 100. The entertainment audio processing system 100 includes a music limiter 106. The music limiter 106 attenuates (or reduces) an audio signal 102. The audio signal 102 received by the music limiter 106 includes at least one of an audio music signal. An illustrative audio signal 102 corresponds to an entertainment audio (e.g., music audio), and a separate, audio announcement signal 115 pertains to a navigation system audio instruction or an incoming cell phone call. The music limiter 106 attenuates the audio music signal to maintain a desired music-to-announcement ratio. The music-to-announcement ratio indicates how much quieter or louder the music audio is relative to the announcement audio. The music-to-announcement ratio is based on one or more applications, such as the make and model of different vehicle types.

FIG. 1 additionally shows non-entertainment audio processing circuitry 128 that processes a non-entertainment audio signal 130 to generate a processed non-entertainment audio signal 132. The processed entertainment (e.g., music) audio signal 122 is combined downstream with the processed non-entertainment audio signal 132. The entertainment audio processing system 100 of FIG. 1 works in parallel with non-entertainment audio processing circuitry (not shown), such as that described in U.S. patent application Ser. No. 14/791,758, entitled "SIMULATING ACOUSTIC OUTPUT AT A LOCATION CORRESPONDING TO SOURCE POSITION DATA," filed Jul. 6, 2015.

The music limiter 106 calculates a gain parameter based on the music-to-announcement ratio. The gain parameter is applied to the audio music signal so that the music audio is a number of decibels (dBs) quieter or louder than the announcement audio. The music limiter 106 of an example actively adjusts the level of the audio music signal relative to the level of the audio announcement signal based on volume control information for announcements and music 118, 120. For instance, the music-to-announcement ratio is dynamically adjusted based on a change in the volume control information for an announcement 118 and music 120.

For example, when a particular make and model of a vehicle is determined to have a desirable music-to-announcement ratio of 10 dB (i.e., the music audio is 10 dB quieter than the announcement audio) and upon a determination by the music limiter 106 that the attenuation of the audio music signal relative to the audio announcement signal is only 5 dB, the music limiter 106 further attenuates the audio music signal by 5 dB so that the music-to-announcement ratio is approximately 10 dB. In another example, the music limiter 106 performs no attenuation when it is determined that the attenuation of the audio music signal relative to the audio announcement signal is already greater than or equal to 10 dB. Thus, the music limiter 106 enables the entertainment audio processing system 100 to maintain a particular music-to-announcement ratio. According to a particular implementation, the music-to-announcement ratio may correspond to a value ranging from 6 dB to 10 dB. The 6 dB to 10 dB range may be associated with an optimum value applicable to a majority of various vehicular makes and models.

According to another particular implementation, the music limiter 106 stores a plurality of previously calculated music-to-announcement ratios. The music limiter 106 determines a gain parameter based on the plurality of previously calculated music-to-announcement ratios. The music limiter 106 applies the gain parameter to an audio music signal so that a music audio is a number of dBs quieter than an announcement audio. The previously calculated music-to-announcement ratios enables the music limiter 106 to predict what level an audio announcement signal should be at when a particular announcement comes back. The music limiter 106 may correspond to a dynamic range limiter or attenuator.

An implementation of the entertainment audio processing system 100 includes a mixer 108 and a equalizer 110. The mixer 108 and the equalizer 110 enable a change of spatial perception of an audio music signal to a listener. With the change of spatial perception, focus is deviated from the music audio to the announcement audio. The mixer 108 partially or completely collapses an audio music signal to mono by making a left audio music signal and a right audio music signal similar to each other. For example, the mixer 108 corresponds to a matrix with a tunable attenuation on S-component. An algorithm associated with the mixer 108 utilizes the following equations:

$$L\_out=(2-G)/2*L\_in+G/2*R\_in$$

$$R\_out=(2-G)/2*R\_in+G/2*L\_in$$

where G=0 produces stereo, G=1 yields mono, and continuously varies between the two possible values of G.

The equalizer 110 introduces, or inserts, magnitude and phase differences between the left audio music signal and the right audio music signal. A magnitude and phase of the left audio music signal is varied relative to a magnitude and phase of the right audio music signal. A result of the introduced magnitude and phase differences is energy of the audio music signal that is distributed across all of one or more downstream processors outputs. A resulting output sound of a speaker is evenly spread around the listener. The introduced magnitude and phase differences may correspond to values determined by the manufacturer of the entertainment audio processing system or the vehicle. According to a particular implementation, the introduced magnitude and phase differences are optimized or tuned for a particular vehicle or a particular application. The equalizer 110 may correspond to a two-channel full-rate finite impulse response (FIR). In FIG. 1, the music limiter 106 is positioned in sequence before the mixer 108 and the equalizer 110. Alternatively, the processes of the music limiter 106 may occur subsequent to those of the mixer 108 and the equalizer 110.

The entertainment audio processing system 100 of FIG. 1 includes an x-fade 112. The x-fade 112 determines whether to select a processed audio signal 124 or an unprocessed audio signal 126 based on an announcement trigger signal 114 initiated by the non-entertainment audio processing circuitry 128. The announcement trigger signal 114 provides an indication to the entertainment audio processing system 100 that an announcement audio is present. The announcement trigger signal 114 is output by a system responsible for generating the announcement audio.

The processed audio signal 124 corresponds to the audio signal 102 that is processed by at least one of the music limiter 106, the mixer 108, and the equalizer 110. The unprocessed audio signal 126 corresponds to an output signal of a latency compensator 116. The latency compensator 116 introduces a time delay that matches a time delay associated with the processed audio signal 124. The time delay associated with the processed audio signal 124 is due to at least one of the music limiter 106, the mixer 108, the equalizer 110, or a fixed attenuator 104. Thus, the x-fade 112 enables a gradual change of an digital audio signal 122 so that a listener will not notice an abrupt change to the level of the audio music signal relative to the level of the audio announcement signal. The downstream processor(s) receive the digital audio signal 122 and render output audio signals associated with the digital audio signal 122 differently in space.

According to a particular implementation, the entertainment audio processing system 100 includes the fixed attenuator 104. The fixed attenuator 104 attenuates the audio music signal by a fixed amount of dBs to signal a mode change to a listener. For example, the fixed attenuator 104 may further attenuate the level of the audio music signal corresponding to a music-to-announcement ratio that is particular to an application. According to a particular implementation, the entertainment audio processing system 100 may be implemented by a processor (e.g., a DSP).

Figure 2:
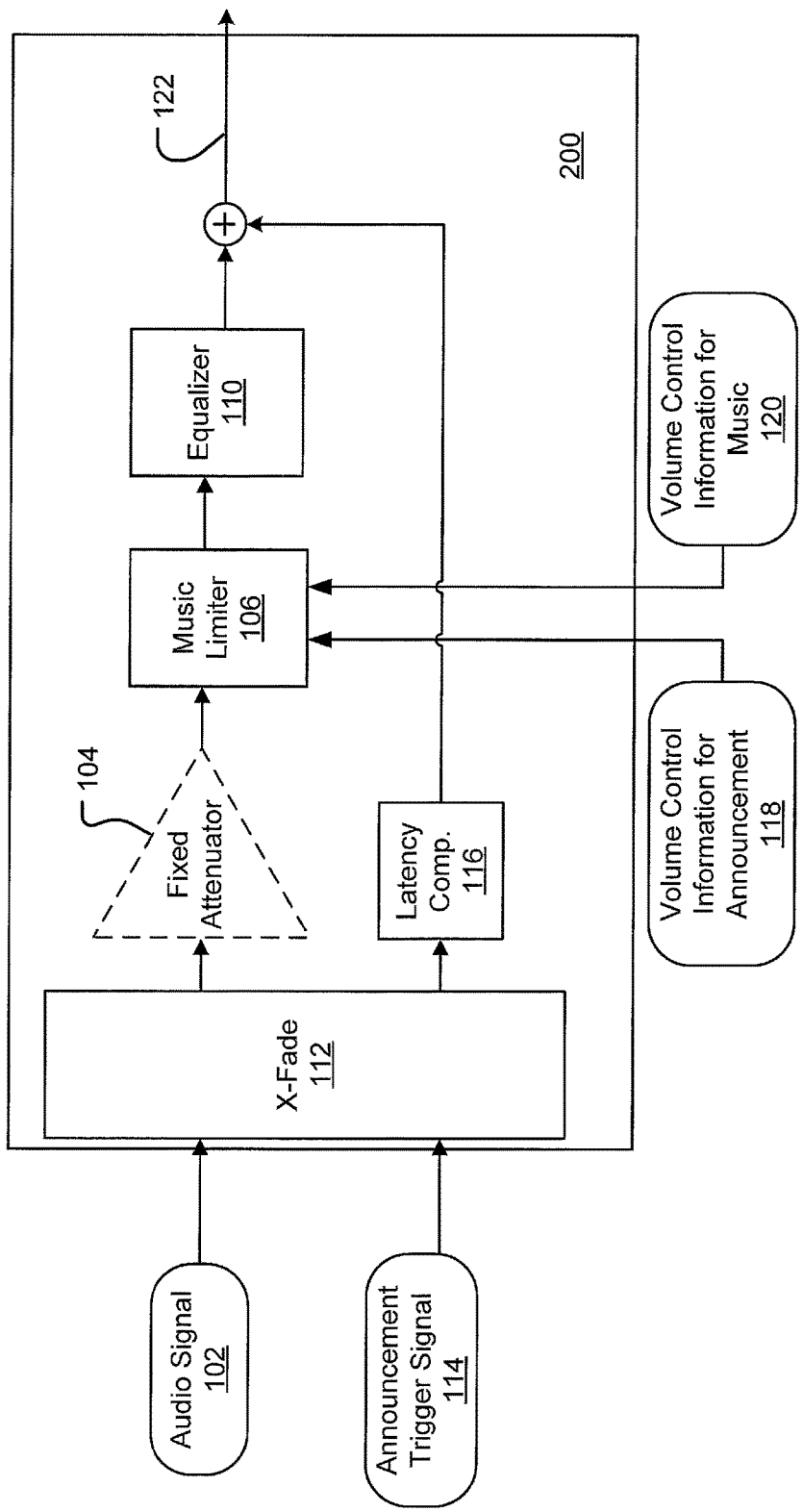
FIG. 2 is a block diagram of an illustrative implementation of an entertainment audio processing system similar to that of FIG. 1 and without a mixer.

FIG. 2 depicts another illustrative implementation of an entertainment audio processing system. An entertainment audio processing system 200 includes one or more elements associated with the entertainment audio processing system 100 of FIG. 1. In this configuration, the X-fade 112 selects between a latency adjusted output of the x-fade 112 and the processed output of the x-fade (i.e., as processed by the fixed attenuator 104, the music limiter 106, and the equalizer 110).

Figure 3:
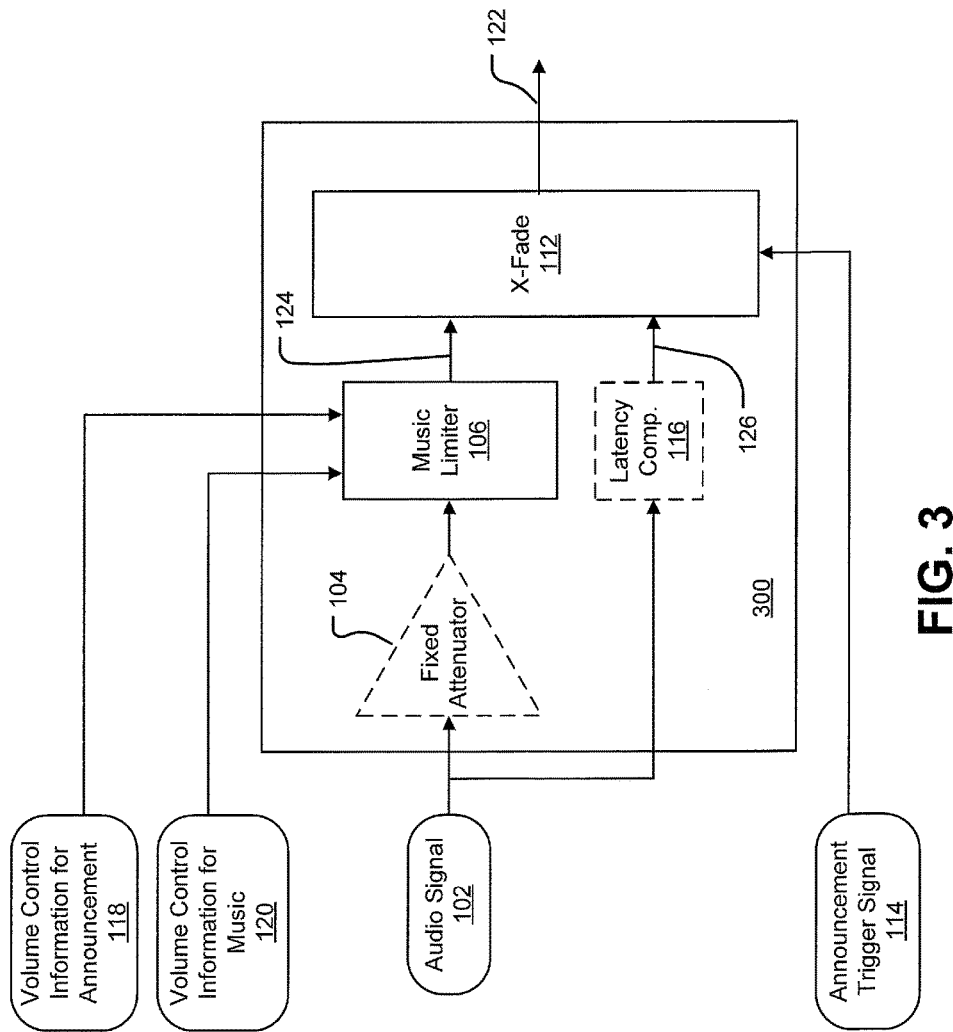
FIG. 3 is a block diagram of another illustrative implementation of an entertainment audio processing system.

FIG. 3 depicts another illustrative implementation of an entertainment audio processing system. An entertainment audio processing system 300 includes one or more elements associated with the entertainment audio processing system 100 of FIG. 1. However, as illustrated in FIG. 3, one or more elements associated with the entertainment audio processing system 100 of FIG. 1 are not included in the entertainment audio processing system 300. For instance, the system 300 of FIG. 3 does not include a mixer or a equalizer.

Figure 4:
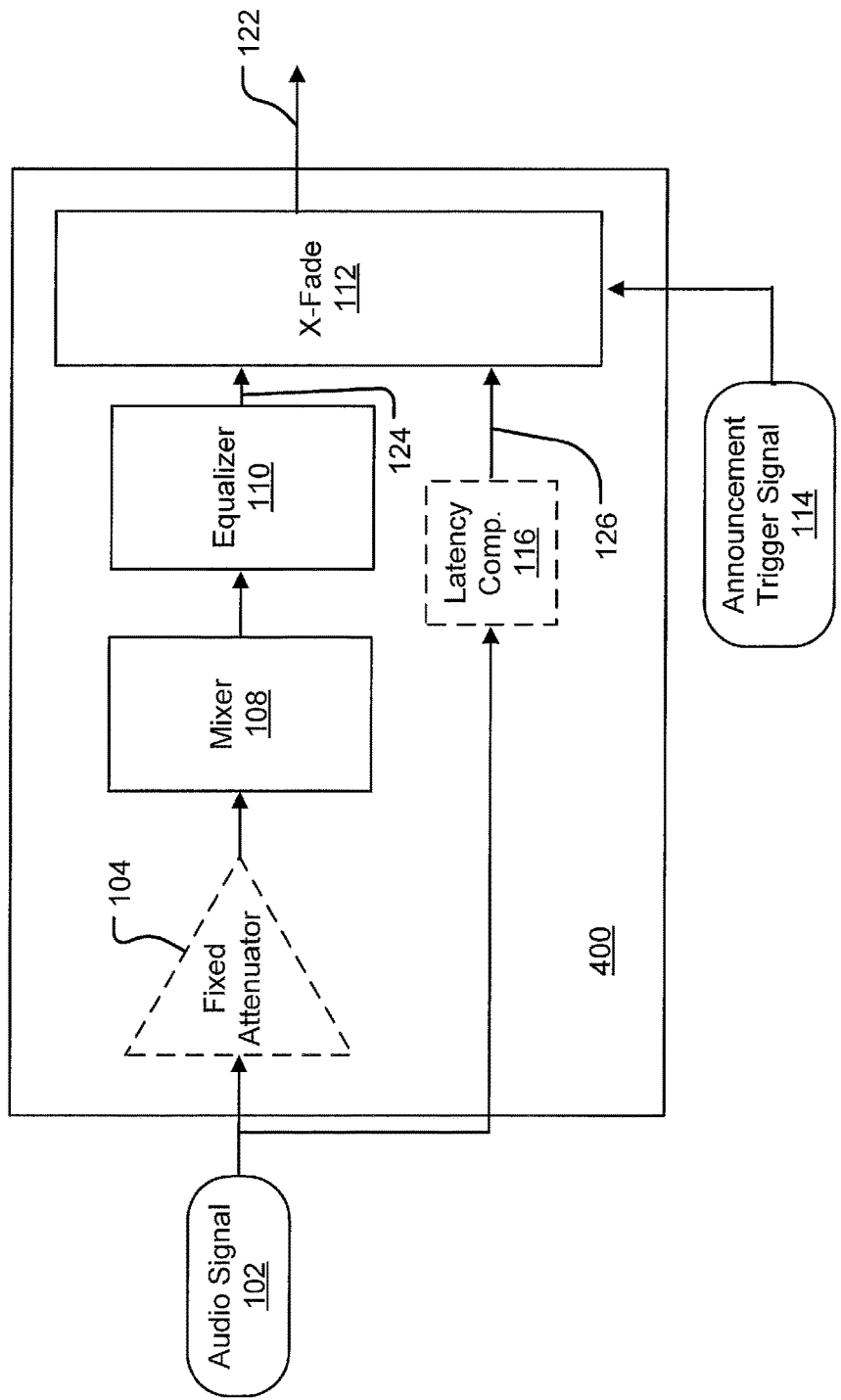
FIG. 4 is a block diagram of another illustrative implementation of an entertainment audio processing system.

FIG. 4 depicts another illustrative implementation of an entertainment audio processing system. An entertainment audio processing system 400 includes one or more elements associated with the entertainment audio processing system 100 of FIG. 1. However, as illustrated in FIG. 4, one or more elements associated with the entertainment audio processing system 100 of FIG. 1 are not included in the entertainment audio processing system 400. For example, the system 400 of FIG. 4 does not include a music limiter or volume control information.

Figure 5:
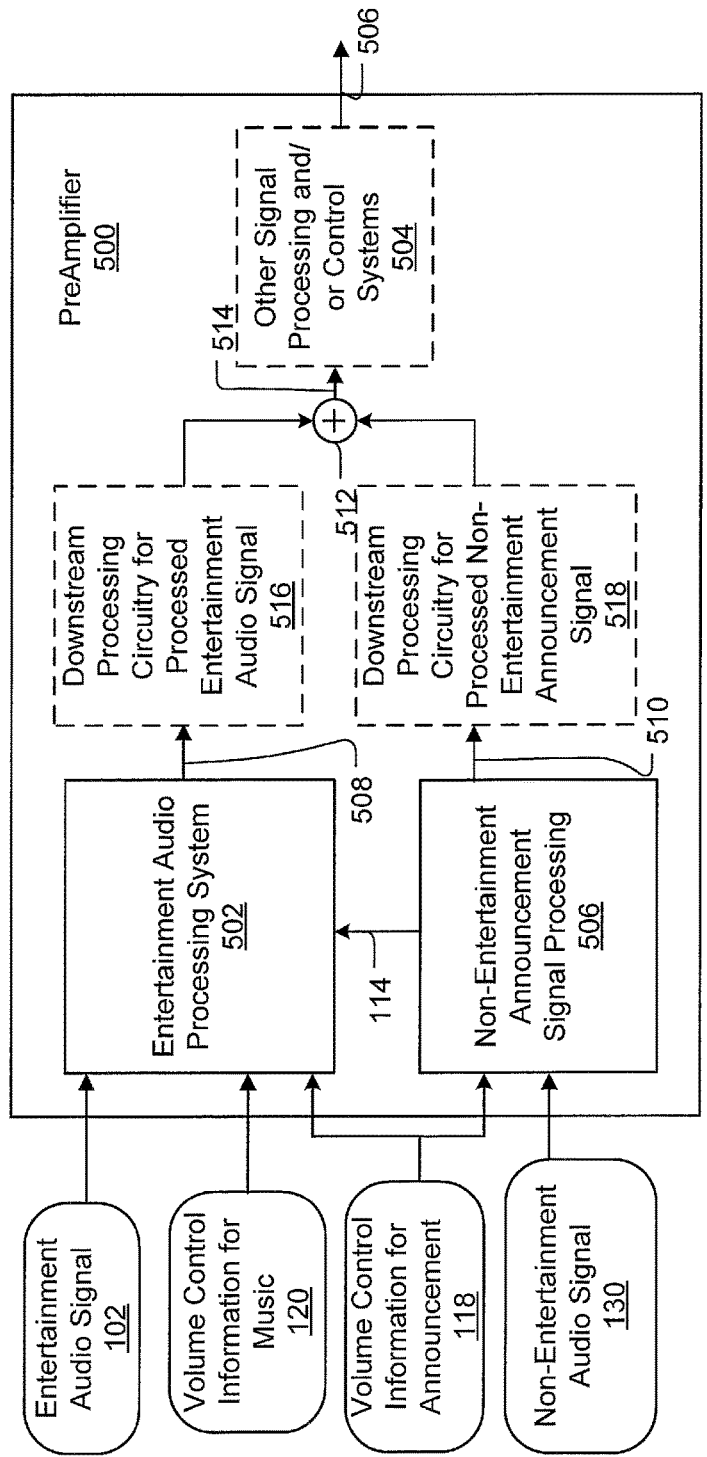
FIG. 5 is block diagram of an illustrative implementation of an entertainment audio processing system included in a pre-amplifier module.

FIG. 5 depicts another illustrative implementation of an entertainment audio processing system. An entertainment audio processing system 502 is included in a pre-amplifier module 500. The entertainment audio processing system 502 may correspond to one of the entertainment audio processing systems 100, 200, 300, 400 of FIG. 1-4. A processed entertainment audio signal 508 may correspond to the digital audio signal 122 of FIGS. 1-4. The processed entertainment audio signal 508 of the entertainment audio processing system 502 is output to other signal processing and/or control systems 504. An output signal 506 of the other signal processing and/or control systems 504 is input to one or more downstream processors of an audio system.

FIG. 5 additionally shows non-entertainment audio processing circuitry 506. The respective outputs of the entertainment audio signal processing circuitry 502 and the non-entertainment audio signal processing circuitry 506 is summed together upstream of the other signal processing and/or control systems 504. The processed entertainment audio signal 508 may be combined with the processed non-entertainment audio 510 at 512. The combined signal 514 may be subjected to downstream processing 504. The downstream processing 504 may include, for example, upmixing the output signal into a number of signal components.

Alternatively or additionally, the processed entertainment audio signal 508 and the processed non-entertainment audio signal 510 may be subjected, respectively, to downstream processing circuitry 516 and 518 before they are combined at 512. That is, downstream processing may be performed on the processed entertainment audio signal 508 and the processed non-entertainment audio signal 510, individually, as an alternative to or in addition to the downstream processing of the combined signal at block 504.

Figure 6:
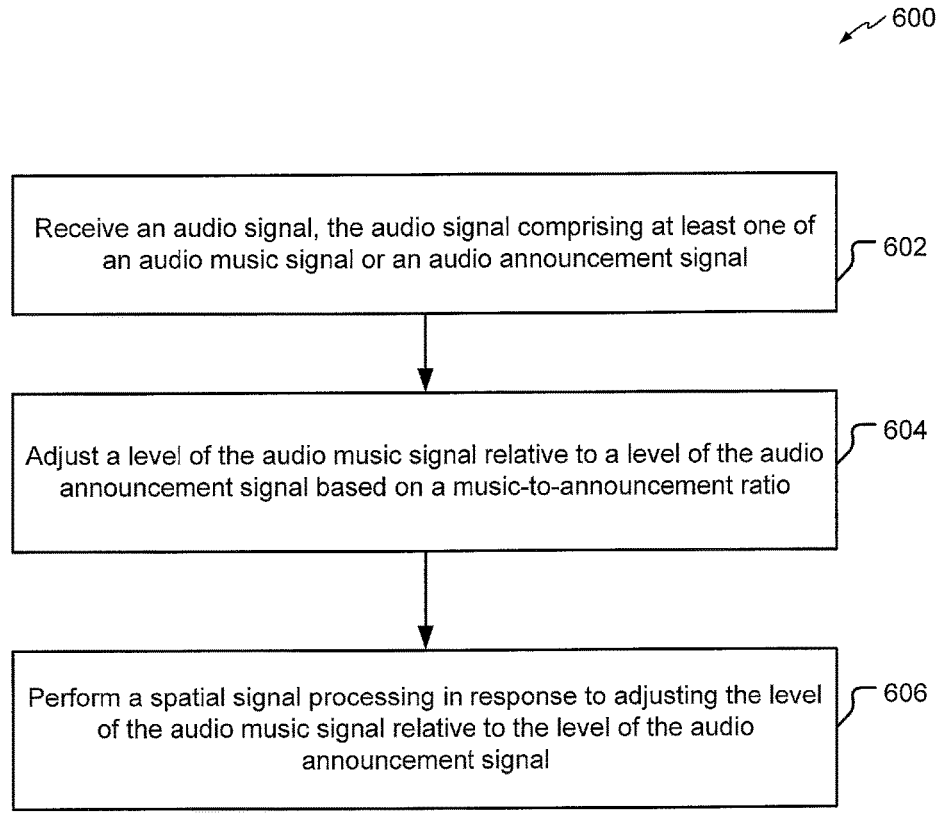
FIG. 6 is a flowchart of an illustrative implementation of a method for an entertainment audio processing system.

FIG. 6 depicts a flowchart diagram representing an implementation of a method 600 for an entertainment audio processing system. The method 600 may be implemented in one of the entertainment audio processing systems 100, 200, 300, 400 of FIG. 1-4 or the entertainment audio processing system 502 of FIG. 5. In one aspect, the method 600 is implemented in a digital signal processor.

The method 600 includes, at 602, receiving an audio signal. For example, the fixed attenuator 104 of FIGS. 1-4 receives the audio signal. In another example, the music limiter 106 of FIGS. 1 and 3 receives the audio signal. In another example, the mixer 108 of FIG. 4 receives the audio signal. In another example, the x-fade 112 of FIG. 2 receives the audio signal. The audio signal includes at least one of an audio music signal or an audio announcement signal.

The method 600 includes, at 604, adjusting a level of the audio music signal relative to a level of the audio announcement signal based on a music-to-announcement ratio. For example, the music limiter 106 of FIGS. 1-3 adjusts the level of the audio music signal relative to the level of the audio announcement signal.

The method 600 includes, at 606, performing a spatial signal processing in response to adjusting the level of the audio music signal relative to the level of the audio announcement signal. For example, the mixer 108 and the equalizer 110 of FIGS. 1, 2, and 4 perform the spatial signal processing in response to adjusting the level of the audio music signal relative to the level of the audio announcement signal.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a DSP, a microcontroller, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed one or more processing devices at one site or distributed across multiple sites and interconnected by a network.

Actions associated with implementing all or part of the functions can be performed by one or more programmable processors or processing devices executing one or more computer programs to perform the functions of the processes described herein. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Those skilled in the art may make numerous uses and modifications of and departures from the specific apparatus and techniques disclosed herein without departing from the inventive concepts. For example, selected implementations of an entertainment audio processing system in accordance with the present disclosure may include all, fewer, or different components than those described with reference to one or more of the preceding figures. The disclosed implementations should be construed as embracing each and every novel feature and novel combination of features present in or possessed by the apparatus and techniques disclosed herein and limited only by the scope of the appended claims, and equivalents thereof.

The invention claimed is:

1. An apparatus comprising:
a music limiter configured to:
receive an audio signal, volume control information for music, and volume control information for announcement, wherein the audio signal comprises a left audio signal channel and a right audio signal channel;
calculate a gain parameter based on a music-to-announcement ratio;
apply the gain to the audio signal; and
output a modified audio signal that includes the applied gain;
a mixer coupled to the music limiter, the mixer configured to collapse the left audio signal channel to mono and to collapse the right audio signal channel to mono; and
an equalizer coupled to the mixer and configured to change a spatial perception of a listener by introducing magnitude and phase differences between the left audio signal channel and the right audio signal channel.

2. The apparatus of claim 1, wherein the music-to-announcement ratio is an indication of how much quieter or louder the music is relative to the announcement.

3. The apparatus of claim 2, wherein the music-to-announcement ratio is based on a particular application.

4. The apparatus of claim 1, wherein the application of the gain parameter to the audio signal corresponds to an adjustment of signal level of the music relative to signal level of the announcement.

5. The apparatus of claim 1, wherein the music limiter is further configured to dynamically adjust the music-to-announcement ratio based on a change in the volume control information for the music and a change in the volume control information for the announcement.

6. The apparatus of claim 1, further comprising a mixer coupled to the music limiter and configured to substantially match the left audio signal channel and the right audio signal channel.

7. The apparatus of claim 1, wherein the magnitude and phase differences are based on a particular application.

8. The apparatus of claim 1, further comprising an x-fade configured to select between a processed audio signal and an unprocessed audio signal.

9. The apparatus of claim 8, wherein the x-fade is further configured to receive an announcement trigger signal.

10. The apparatus of claim 1, further comprising a fixed attenuator coupled to the music limiter and configured to reduce a level of the audio signal based on a particular amount.

11. An apparatus comprising:
a mixer configured to substantially match a left audio signal channel and a right audio signal channel by collapsing the left audio signal channel to mono and collapsing the right audio signal channel to mono;
an equalizer coupled to the mixer and configured to introduce magnitude and phase differences between the left audio signal channel and the right audio signal channel to change a spatial perception of a listener;
a music limiter configured to calculate a gain parameter based on a music-to-announcement ratio; and
at least one speaker configured to output the left and right audio signal channels.

12. The apparatus of claim 11, wherein the magnitude and phase differences are based on a particular application.

13. The apparatus of claim 12, wherein the music limiter is configured to receive volume control information for music and volume control information for announcement.

14. The apparatus of claim 13, wherein the music limiter is coupled to the equalizer.

15. The apparatus of claim 13, wherein each of the left audio signal channel and the right audio signal channel comprises at least one of an audio music signal or an audio announcement signal.

16. The apparatus of claim 11, further comprising an x-fade configured to select between a first audio signal processed by at least one of the mixer or the equalizer and a second audio signal not processed by the at least one of the mixer or the equalizer.

17. The apparatus of claim 16, wherein the x-fade is further configured to receive an announcement trigger signal.

18. A method comprising:
receiving an audio signal, the audio signal comprising at least one of an audio music signal and an audio announcement signal, wherein the audio signal comprises a left audio signal channel and a right audio signal channel;
adjusting a level of the audio music signal relative to a level of the audio announcement signal based on a music-to-announcement ratio;
changing a spatial perception of a listener by collapsing the left audio signal channel to mono and collapsing the right audio signal channel to mono to make the left audio signal channel similar to the right audio signal channel;
introducing magnitude and phase differences between the left audio signal channel and the right audio signal channel; and
outputting a modified audio signal that includes the adjusted level of audio music signal.

19. The method of claim 18, further comprising performing spatial signal processing in response to adjusting the level of the audio music signal relative to the level of the audio announcement signal.

20. The method of claim 19, wherein the spatial signal processing comprises:
substantially matching the left audio signal channel and the right audio signal channel; and
introducing magnitude and phase differences between the left audio signal channel and the right audio signal channel.

21. The method of claim 20, further comprising determining an input signal to a downstream processor prior to introducing the magnitude and phase differences between the left audio signal channel and the right audio signal channel.

22. The method of claim 18, further comprising selecting between a processed audio signal and an unprocessed audio signal based on an announcement trigger signal.

23. The method of claim 18, further comprising reducing a level of the audio signal based on a particular amount prior to adjusting the level of the audio music signal relative to the level of the audio announcement signal.

24. The method of claim 18, wherein collapsing the left audio signal channel further includes partially or completely collapsing the left audio signal channel to mono.

25. The apparatus of claim 1, wherein collapsing the left audio signal channel further includes partially or completely collapsing the left audio signal channel to mono.

* * * * *